US008154907B2

(12) United States Patent  (10) Patent No.: US 8,154,907 B2
Yoon et al.  (45) Date of Patent: Apr. 10, 2012

(54) METHOD FOR FABRICATING INDIUM (IN)-ANTIMONY (SB)-TELLURIUM (TE) NANOWIRES AND PHASE-CHANGE MEMORY DEVICE COMPRISING THE NANOWIRES

(75) Inventors: Soon-Gil Yoon, Daejeon (KR); Jun-Ku Ahn, Daejeon (KR)

(73) Assignee: The Industry & Academic Cooperation in Chungnam National University (IAC), Daejeon (KR)

(*) Notice: Subject to any disclaimer, the term of this patent is extended or adjusted under 35 U.S.C. 154(b) by 61 days.

(21) Appl. No.: 12/871,375

(22) Filed: Aug. 30, 2010

(65) Prior Publication Data

US 2011/0182115 A1  Jul. 28, 2011

(30) Foreign Application Priority Data

Jan. 27, 2010  (KR) .......................... 10-2010-0007311

(51) Int. Cl.
  *G11C 11/00* (2006.01)
(52) U.S. Cl. ........................ 365/148; 365/163; 977/891
(58) Field of Classification Search .................. 365/46,
      365/94, 100, 113, 129, 148, 163; 257/2–5,
      257/9, 296, 310, E21.35, E31.047, E27.006;
      358/29, 95, 96, 166, 135, 240, 259, 365;
      358/482, 486, 597, 785; 977/754.891
  See application file for complete search history.

(56) References Cited

U.S. PATENT DOCUMENTS

| | | | | |
|---|---|---|---|---|
| 7,790,610 B2* | 9/2010 | Lee et al. | ...................... | 438/652 |
| 2006/0284218 A1* | 12/2006 | Kaner et al. | .................. | 257/288 |
| 2008/0178921 A1* | 7/2008 | Ye | ................................ | 136/225 |
| 2009/0162998 A1* | 6/2009 | Lee et al. | ...................... | 438/478 |
| 2010/0127241 A1* | 5/2010 | Gruner et al. | ................... | 257/20 |
| 2010/0314600 A1* | 12/2010 | Lee et al. | .......................... | 257/2 |

OTHER PUBLICATIONS

Ahn, Jun-Ku; et al. "Phase-Change InSbTe Nanowires Grown in Situ at Low Temperature by Metal-Organic Chemical Vapor Deposition"; ACS Publications, NANO Letters; Web page, 2009.
Ahn, Jun-Ku; et al. "Phase-Change InSbTe Nanowires Grown in Situ at Low Temperature by Metal-Organic Chemical Vapor Deposition"; ACS Publications, NANO Letters; 2009.
Lencer, D. et al.; "A map for phase-change materials", Nature Materials, vol. 7, 2008.
Maeda, Y, et al; "Reversible phase-change optical data storage in InSbTe alloy films" J. Appl. Phys. 64 (4), 1988.
Lee, J.I., et al., "Highly Scalable Phase Change Memory with CVD GeSbTe for Sub 50nm Generation"; Symposium on VLSI Technology Digest of Technical Papers; pp. 102-103; 2007.
Jung, Y.; Synthesis and Characterization of GeSbTe Nanowires with Memory Switching Effect; ACS Publications, http://pubs.acs.org; May 12, 2009.
Lee, S., et al., "Highly Scalable Non-Volatile and Ultra-low-Power Phase-Change Nanowire Memory" Nature Nanotechnology, vol. 2, Oct. 2007.
Ahn, J., et al., Metalorganic Chemical Vapor Deposition of Non-GST Chalcogenide Materials for Phase Change Memory Applications Journal of Materials Chemistry, http://www.rsc.org/delivery/_ArticleLinking/ArticleLinking.cfm?JournalCode=JM&Year=2010& Man; 2010.

* cited by examiner

*Primary Examiner* — Richard Elms
*Assistant Examiner* — Harry W Byrne
(74) *Attorney, Agent, or Firm* — Edwards Wildman Palmer LLP (57) ABSTRACT

Disclosed herein is a method for manufacturing (In)—(Sb)—(Te) (IST) nanowires and a phase-change memory device comprising the nanowires. The method comprises providing a substrate and vapors of In, Sb and Te precursors in a chamber and allowing the vapors to react with each other on the substrate in the chamber at a temperature of 230-300° C. and a pressure of 7-15 Torr. With the method, IST nanowires can be fabricated cost-effectively.

4 Claims, 6 Drawing Sheets

METHOD FOR FABRICATING INDIUM (IN)-ANTIMONY (SB)-TELLURIUM (TE) NANOWIRES AND PHASE-CHANGE MEMORY DEVICE COMPRISING THE NANOWIRES

CROSS-REFERENCE TO RELATED APPLICATIONS

This application claims the benefit of Korean Patent Application No. 2010-7311, filed on Jan. 27, 2010, which is incorporated herein by reference in its entirety.

BACKGROUND (a) Technical Field

The present invention relates to a method for manufacturing indium (In)-antimony (Sb)-tellurium (Te) nanowires and a phase-change memory device comprising the nanowires.

(b) Background Art

Semiconductor memories are classified into two groups: dynamic random access memory (DRAM) and non-volatile random access memory (NVRAM). The DRAM, while having a large market, consumes much power because the information stored therein is volatile so that the same information should be stored again in a very short interval. Accordingly, NVRAM devices, which are characterized by low cost while having a storage density comparable to that of DRAM and an operating speed comparable to that of static random access memory (SRAM), have received a great deal of attention as next-generation memories. Among these NVRAM devices, phase-change memory (also termed "Ovonic Unified Memory" (OUM), "Phase-Change RAM" (PRAM) or "Chalcogenide RAM" (CRAM)) is formed of a chalcogenide material which shows the electrical and optical switching between amorphous and crystalline states, and it records, erases and reproduces information by the difference in electrical resistance between the two states. The phase-change memory exhibits very excellent properties such as a fast operating speed and a high level of integration, has a simple device structure and is manufactured by a simple process, and thus it has an advantage in that it is easy to achieve cost effectiveness while having high information storage and processing capacities.

As a material for phase-change memory devices, $Ge_2Sb_2Te_5$ (GST) is being widely studied. The GST has a crystallization temperature (about 130° C.), which is much lower than the decomposition temperatures of precursors which are used when the GST is deposited, particularly on a trench structure, and thus if the GST is deposited on a portion of a trench, it will be rapidly crystallized to close the trench. Accordingly, the GST has a problem in that it is difficult to reproducibly fill the trench structure. Accordingly, there is a need for a material that can substitute the GST material.

In—Sb—Te (IST) exhibits the properties of phase-change memory in various compositions, including $In_3SbTe_2$. The IST is expected as a phase-change memory material capable of substituting for the GST material, because it has a crystallization temperature of 290° C. or higher, a high melting point (about 626° C.) and a low reset current. Accordingly, there have been studies on top-down photolithographic processes which comprise depositing a phase-change material on a planar structure by a sputtering method to form a thin film, etching the thin film to form a device, and evaluating the properties of the device.

In order to manufacture a PRAM having faster switching properties and requiring low power consumption, it is necessary to reduce the size of a GST cell. However, when the GST cell size is 100 nm or less, due to material damage during a photolithographic process, a set resistance value becomes larger, a sensing region becomes smaller, and reading speed also becomes slower. As an alternative to solve the problems of the top-down process, a method of manufacturing a memory device by depositing a phase-change material on a previously formed trench structure using a method such as sputtering is attracting a great deal of attention. However, in the case of the sputtering method, it is difficult to deposit the phase-change material on a trench structure having a size of 300-400 nm or smaller, and even if the trench structure is filled with the phase-change material, pores occur in the remaining portion of the trench structure. For this reason, the use of the sputtering method to manufacture a small device having a size of 200 nm or smaller is limited.

A chemical deposition method provides excellent step coverage and easily achieve large-area deposition, and thus it is expected to be suitable for the mass production of small-sized devices.

Moreover, nanowires which have recently been actively studied are important materials fabricated by a bottom-up method, and they can significantly increase the density of memory devices. Thus, the results of studies on phase-change memories employing GST nanowires have been reported. GT or GST nanowires of diameter of about 30-150 nm have a very small number of defects, and thus need low reset current and store data for a long period of time, compared to PRAM devices manufactured by existing photolithographic processes. However, a phase-change memory employing IST nanowires has not yet been studied. In addition, because GST nanowires are fabricated by a vapor-liquid-solid method in which the growth of GST nanowires is induced by evaporating GeTe(GT) and $Sb_2Te_3$(ST) powders and supplying the evaporated materials to a substrate having an Au catalyst, they require a high-temperature process. Accordingly, a method capable of fabricating nanowires made of such phase-change materials at low temperature is necessarily required.

The above and other features and advantages of the present invention will be apparent from or are set forth in more detail in the accompanying drawings, which are incorporated in and form a part of this specification, and the following Detailed Description, which together serve to explain by way of example the principles of the present invention.

SUMMARY

Accordingly, the present invention has been made in view of the problems occurring in the prior art, and it is an object of the present invention to provide a method capable of fabricating a large amount of nanowires made of the phase-change material In—Sb—Te (IST) at a temperature of 300° C. or lower.

Another object of the present invention is to provide a method of manufacturing a memory device comprising the nanowires manufactured by the method.

To achieve the above objects, the present invention provides a method of fabricating indium IST nanowires by metal organic chemical vapor deposition. The method comprises: providing a substrate and vapors of In, Sb and Te precursors in a chamber; and allowing the vapors to react with each other on the substrate in the chamber at a temperature of 230-300° C. and a pressure of 7-15 Torr.

Preferably, the In precursor may be In(CH3)3, In(C2H5)3, In(C11H19O2)3 or In(OOCCH3)3, the Sb precursor may be Sb(CH3)3, Sb(C2H5)3 or Sb(i-C3H7)3, and the Te precursor may be Te(CH3)2, Te(C2H5)2, Te(i-C3H7)2 or Te(t-C4H9)2.

The nanowires fabricated by the present invention have a diameter of 30-100 nm.

The present invention also provides a phase-change memory device comprising the IST nanowires.

BRIEF DESCRIPTION OF THE DRAWINGS

The above and other objects, features and advantages of the present invention will be more clearly understood from the following detailed description taken in conjunction with the accompanying drawing, in which.

DETAILED DESCRIPTION OF THE INVENTION

Hereinafter, the present invention will be described in detail with reference to the accompanying drawings and the following examples. It is to be understood, however, that these drawings and examples are illustrative purposes only and are not to be construed to limit the sprit or scope of the present invention.

In general, thin-film formation by chemical vapor deposition is achieved through various procedures, including adsorption, a chemical reaction, and desorption, on a substrate heated by diffusion of source vapors. Herein, the reaction in a gaseous state in regions other than the substrate surface should be suppressed as possible, and for this purpose, the source vapors are allowed to react in a vacuum chamber at low deposition pressure. If the deposition pressure is increased, the source vapors will be supersaturated so that they will react in a vapor state rather than the substrate surface to form powder. The present inventors have found that powder formed on the substrate surface by controlling the deposition pressure within a suitable range can act as a nucleus to fabricate nanowires, thereby completing the present invention.

In the preset invention, the pressure in the chamber (deposition pressure) during the reaction is preferably 7-15 Torr. If the deposition pressure is lower than 7 Torr, a thin film rather than nanowires may be deposited, and if the deposition pressure is higher than 15 Torr, the formed nanowires may agglomerate with each other, or defects may occur due to an increase in the reaction in the gaseous state.

The temperature of the substrate during the reaction is preferably between 230° C. to 300° C. When the temperature of the substrate is lower than 230° C., the reaction of the source vapors on the substrate may not sufficiently occur, and thus nanowires may not be formed due to low deposition efficiency, and when the substrate temperature is higher than 300° C., nanopowder may be deposited to form a thin film having a rough surface.

Although Examples below illustrated only the results of deposition at 250° C., deposition carried out at varying temperatures of 230 to 300° C. at the same deposition pressure showed the same results as deposition at 250° C., except that when the deposition temperature was increased, the production and growth rate of nanowires became faster. The deposition time under the same conditions determined the length of nanowires, and as the deposition time became longer, the length of nanowires obtained became longer.

The precursors of In, Sb and Te may be sources of In, Sb and Te, and any precursor may be used in the present invention, as long as it may be used for metal organic chemical vapor deposition of each of the metals. In Examples of the present invention, the deposition of In, Sb and Te was carried out in a bubbler-type CVD system, which is generally widely used in the art, using $In(CH_3)_3$ (TMI), $Sb(C_3H_7)_3$ (Sb (iPr)$_3$) and $Te(C_3H_7)_2$ or (Te(iPr)$_2$) as precursors of the respective metals, but the scope of the present invention is not limited to these precursors, and $(In(C_2H_5)_3)$ $In(C_{11}H_{19}O_2)$ or $In(OOCCH_3)$ as an In source, $Sb(CH_3)_3$ or $Sb(C_2H_5)_3$ as a Sb source and $Te(CH_3)_2$, $Te(C_2H_5)_2$ or $Te(t-C_4H_9)_2$ as a Te source may be used in the present invention.

Analysis by a high-resolution TEM photograph indicated that nanowires formed according to the present invention had a diameter of 30-100 nm and existed as a single crystalline phase (detailed data not shown). Also, no catalyst was detected at the ends of the nanowires, suggesting that the nanowires were not those formed by a catalyst.

Examples of the present invention illustrated only the results obtained when the temperature of the bubbler was set at 10° C. for In and Te and 10° C. for Sb, but the results of experiments conducted at varying bubbler temperatures indicated that the composition of nanowires formed could be controlled by adjusting the bubbler temperature for each metal. Namely, by increasing the bubbler temperature for any of the metals, an IST thin film having an increased content of the metal could be obtained. Also, the molar ratio of Sb showed a tendency to increase as the deposition pressure or the deposition temperature increased under the same conditions. Although detailed data were not presented, experiments were carried out in various conditions while changing the bubbler temperature, the deposition pressure and the deposition temperature and, as a result, In—Sb—Te nanowires having a molar ratio of In:Sb:Te of 2.5-3.5:0.5-1.5:2.0-4.0 could be fabricated.

A phase-change memory device may be manufactured in the form of a field effect transistor by separating the above-fabricated nanowires from the substrate, horizontally arranging the separated nanowires on another substrate and subjecting the arranged nanowires to metal patterning to form source, drain and gate electrodes. Alternatively, the IST nanowires may be vertically grown directly on an already commercialized phase-change memory device.

The present invention also relates to the use of the IST nanowires formed according to the above-described method in the manufacture of phase-change memory devices employing nanowires widely known in the art, and the detailed structure of the phase-change memory devices or the method for manufacturing these memory devices is well known in the art, and thus the detailed description thereof will be omitted herein.

Figure 6:
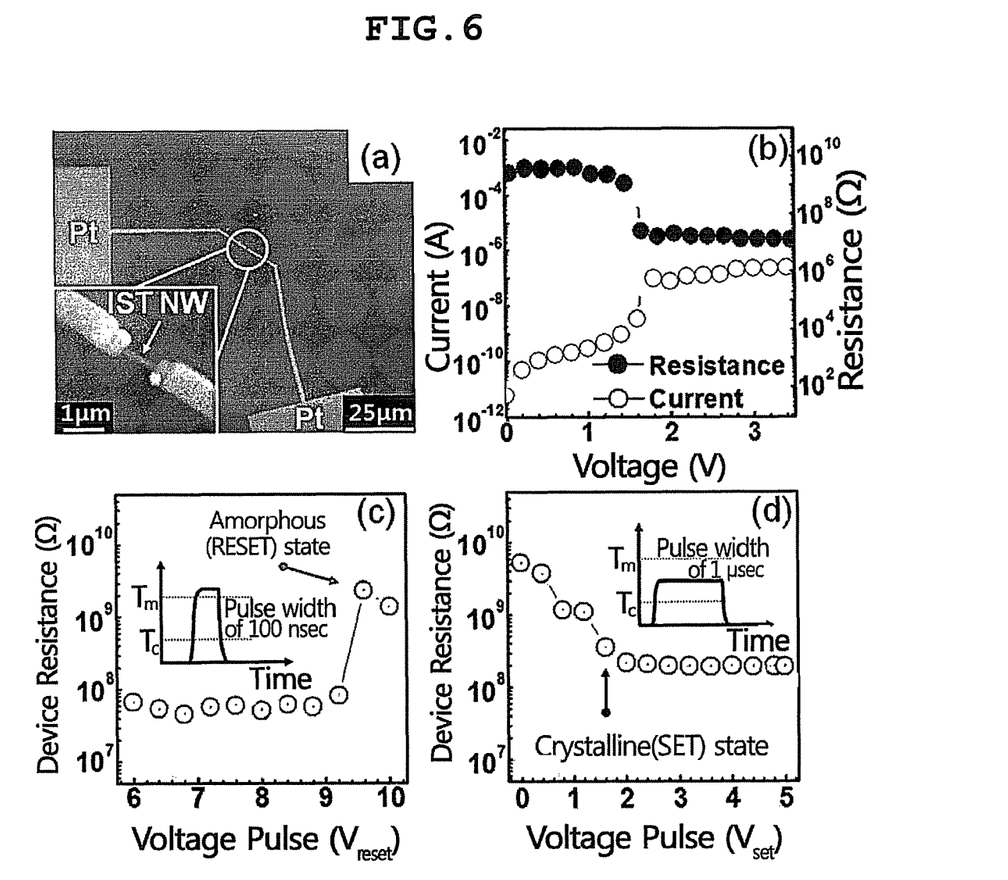
FIG. 6 is a graphic diagram showing the results of measuring the electrical characteristics of IST nanowires after forming Pt pad patterns at both ends thereof.

Meanwhile, Pt pad patters were formed at both ends of the nanowires formed according to the method of the present invention, and the change in resistance of the device resulting from the application of a given voltage or pulse voltage was measured. As a result, it could be seen that the nanowires exhibited memory characteristics.

The following examples illustrate the invention and are not intended to limit the same.

EXAMPLES

Example 1

Metal Organic Chemical Vapor Deposition of IST

Metal organic chemical vapor deposition on 50-nm-thick TiAlN/Si having TiAlN deposited on a silicon wafer as a substrate was carried out using $In(CH_3)_3$ (TMI), $Sb(C_3H_7)_3$ ($Sb(iPr)_3$) and $Te(C_3H_7)_2$ or ($Te(iPr)_2$) as precursors of In, Sb and Te. More specifically, the precursors were charged into three bubblers of an metal organic chemical vapor deposition system, respectively. The temperatures of the bubblers were maintained at 10° C. for the In and Te precursors and 30° C. for the Sb precursor, and Ar gas as a carrier gas added to each of the precursors at a rate of 20 sccm (standard cubic centimeter per minute) and injected through a shower head maintained at about 80° C. The pressure in the chamber was precisely controlled at 1, 3, 5, 7, 10, 12 or 15 Torr by a pressure gauge attached to the chamber. The deposition temperature was adjusted using a temperature sensor attached to the substrate, and the deposition process was carried out at 250° C. for 2 hours. After the deposition process, the specimen was cooled to room temperature and then collected.

Example 2

Analysis of Structural Characteristics of IST Nanowires

Figure 1:
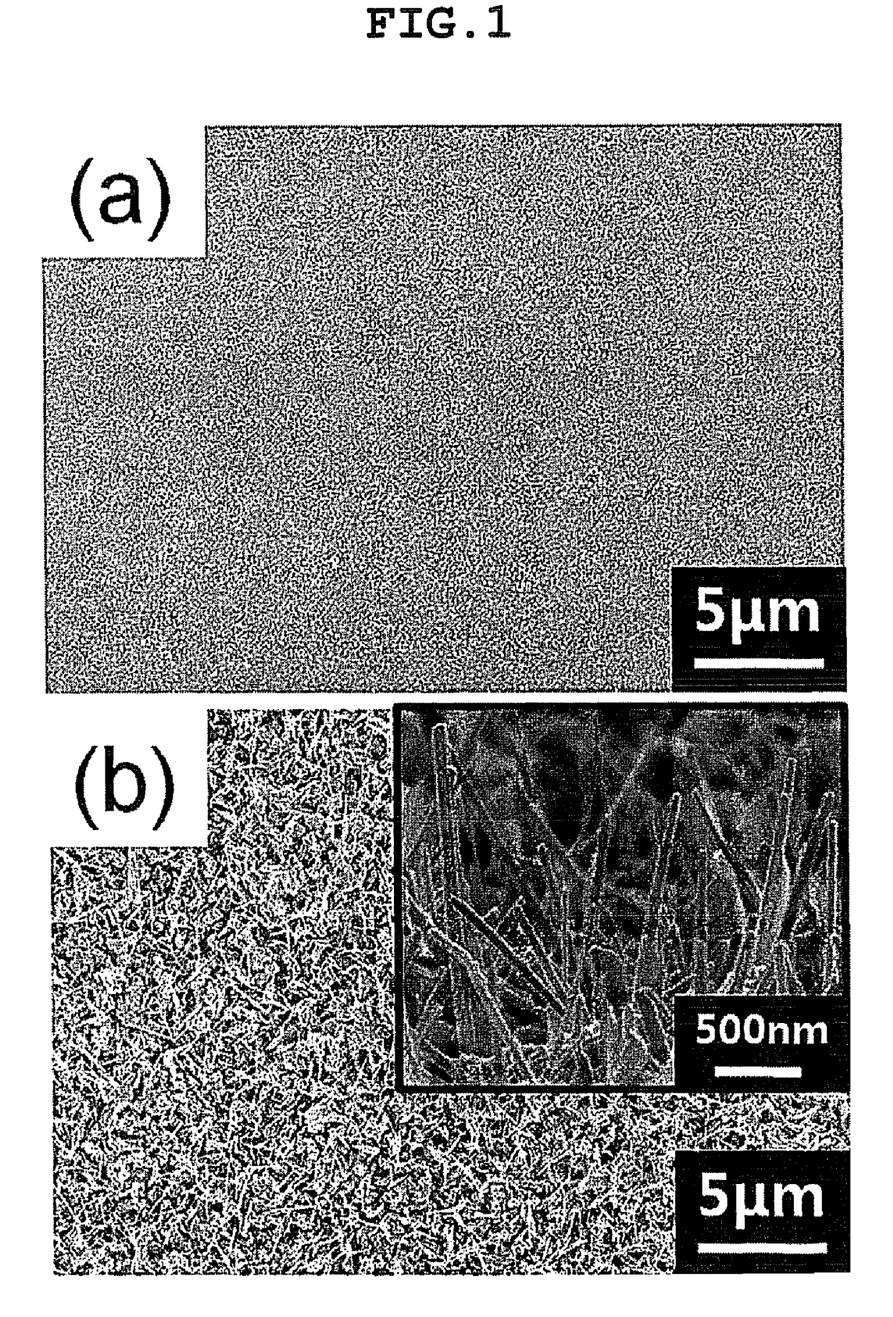
FIGS. 1 and 2 are scanning electron microscope (SEM) photographs showing the surface characteristics according to deposition pressure of IST.

The surface and cross-sectional structure of the IST thin film fabricated in Example 1 were analyzed by a scanning electron microscope (FE-SEM, Sirion & S-4800), and the analysis results are shown in FIG. 1. FIGS. 1(a) and 1(b) show SEM surface photographs of the specimens deposited at deposition pressures of $3.9 \times 10^2$ Pa (3 Torr) and $13 \times 10^2$ Pa (10 Torr), respectively. The insert in FIG. 1(b) is a SEM photograph showing the cross-section of the specimen deposited at 10 Torr.

As can be seen in the SEM surface photographs of the specimens in FIGS. 1(a) and 1(b), the deposition process was carried out at a pressure of $3.9 \times 10^2$ Pa (3 Torr), a thin film having a very uniform surface was formed, whereas the specimen deposited at a pressure of $13 \times 10^2$ Pa (10 Torr) had a very rough surface. The insert of FIG. 1(b) showing the cross-sectional structure indicates that infinite nanowires grew.

Figure 2:
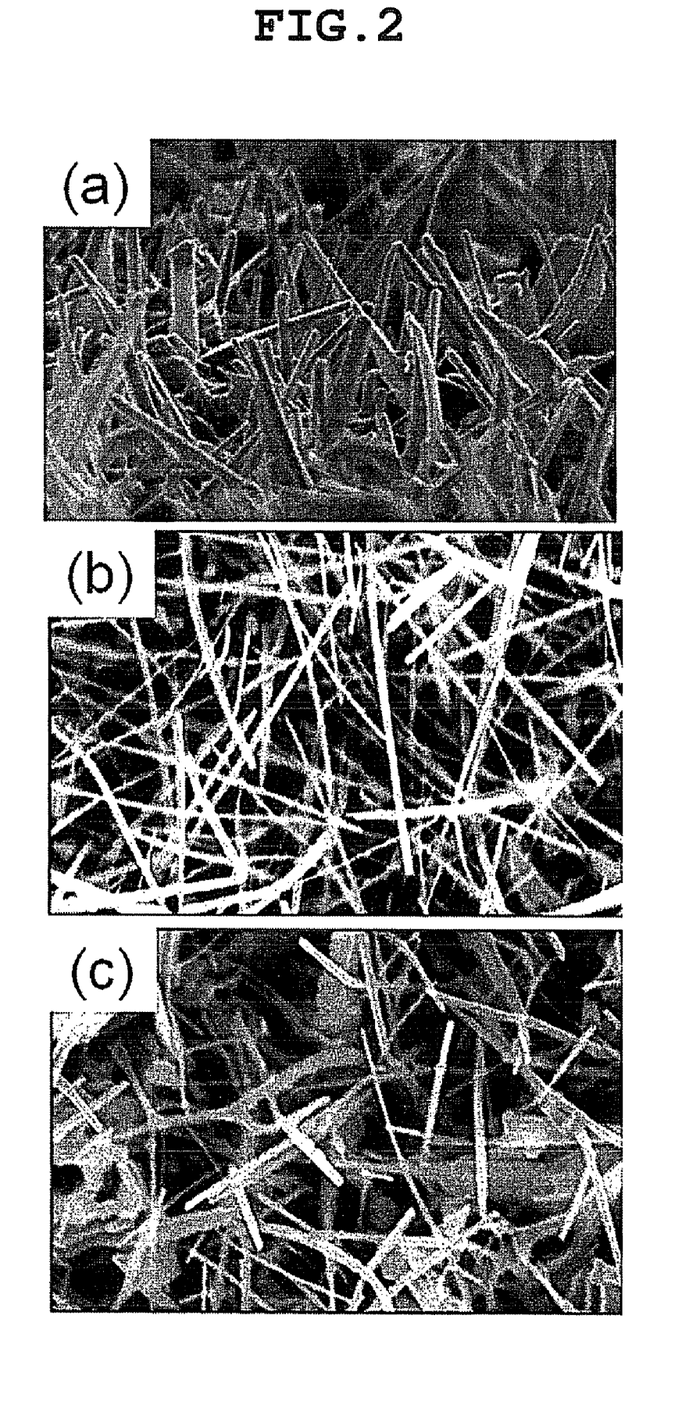

FIG. 2 shows SEM surface photographs of the specimens deposited at pressures of $13 \times 10^2$ Pa (10 Torr) (a), $15.6 \times 10^2$ Pa (12 Torr) (b) and $19.5 \times 10^2$ Pa (15 Torr) (c), respectively, and indicates that nanowires were formed at these deposition pressures. As can be seen therein, the nanowires formed at 10 Torr and 15 Torr showed a very uniform shape, but the nanowires formed at 15 Torr partially agglomerated.

Figure 3:
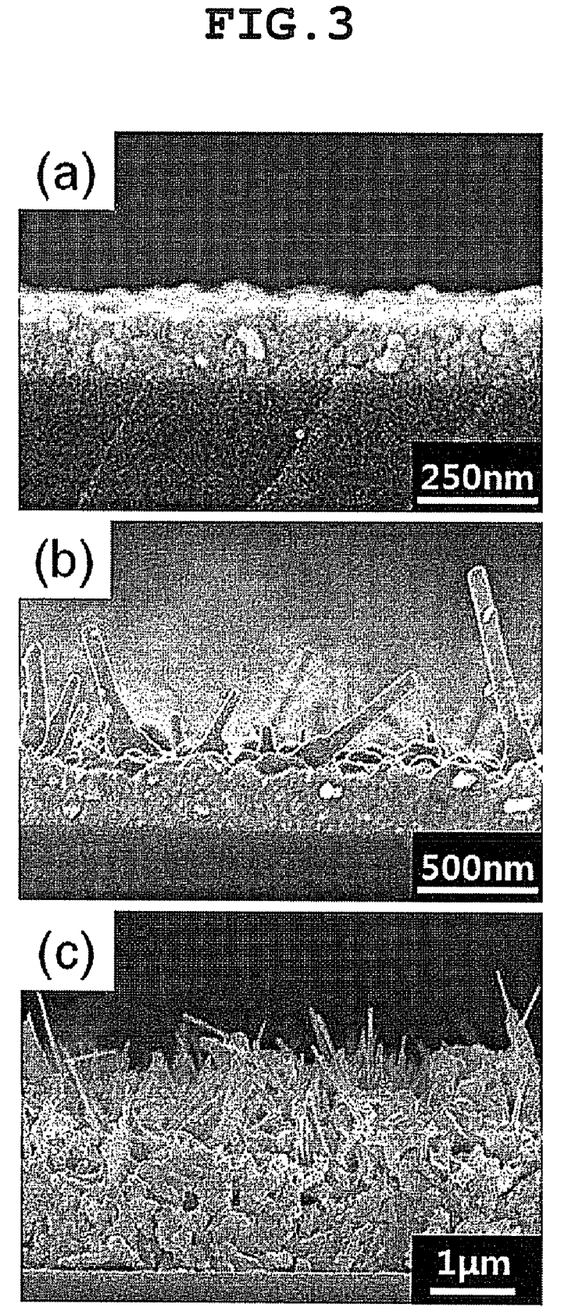
FIG. 3 is a SEM photograph showing the cross-sectional structure according to deposition pressure of an IST thin film.

The cross-sections of specimens according to deposition pressures were photographed in order to observe the cross-sectional structures in further detail, and the photographs are shown in FIG. 3. FIGS. 3(a) and 3(b) are SEM cross-sectional photographs of the specimens deposited at pressures of $3.9 \times 10^2$ Pa (3 Torr) and $9.1 \times 10^2$ Pa (7 Torr), respectively, and FIG. 3(c) is a SEM cross-sectional photograph of the specimen deposited at a pressure of $13 \times 10^2$ Pa (10 Torr). As can be seen in FIG. 3, when the deposition pressure was low, a thin film having a smooth surface was formed, but when the deposition pressure was increased to $9.1 \times 10^2$ Pa (7 Torr), nanowires grew, and when the deposition pressure was further increased, the density of nanowires increased.

Figure 4:
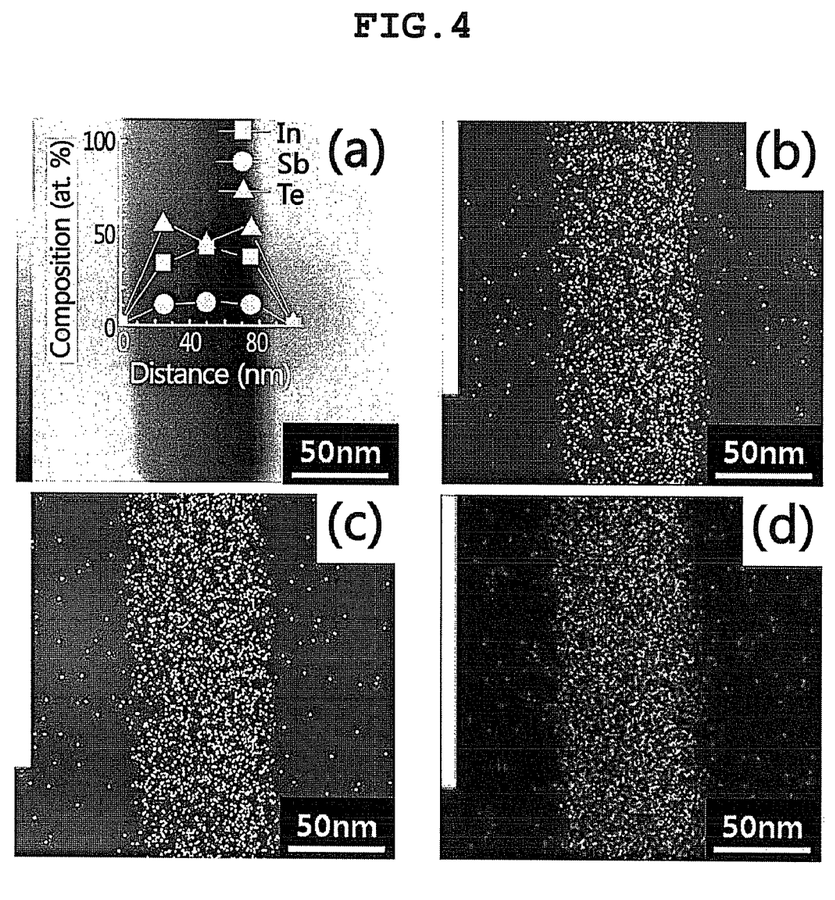
FIG. 4 illustrates a graph showing the change in composition of In, Sb and Te according to diameter of IST nanowires and shows STEM mapping images of In, Sb and Te.

FIG. 4(a) is a graph inserted into a scanning TEM (FE-STEM (200 keV, HD-2300A) image, the graph showing the composition of In, Sb and Te according to diameter of nanowires as measured by TEM-EDS (energy dispersive spectroscopy, FE-STEM (200 keV, HD-2300A)), and FIGS. 4(b), 4(c) and 4(d) show mapping patterns of In, Sb and Te, respectively. As can be seen in FIG. 4(a), the composition of In:Sb:Te according to the diameter of the nanowires was 3.5-4.5:1.0-1.5:3.5-5.5. In addition, as can be seen in FIGS. 4(b) to 4(d), the In, Sb and Te elements were uniformly distributed throughout the diameter of the nanowires.

Figure 5:
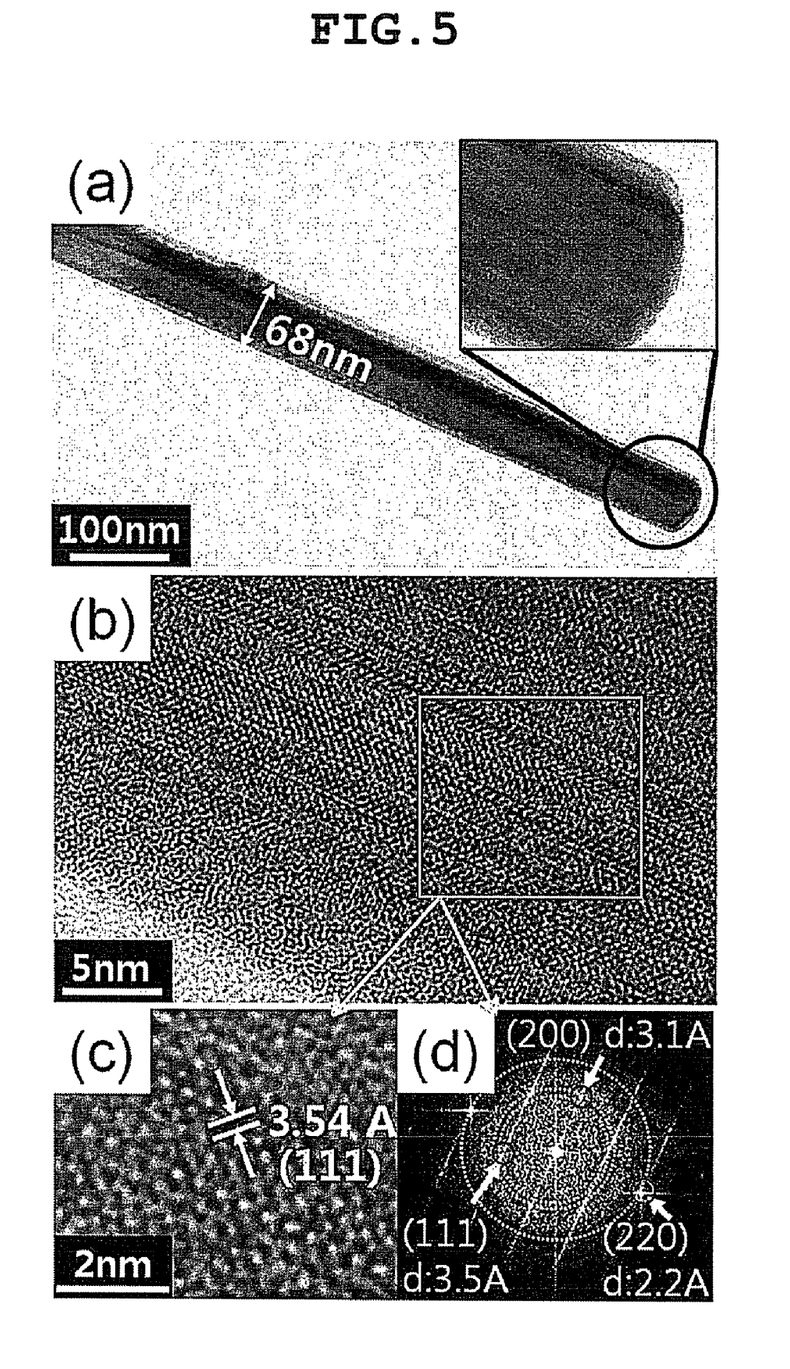
FIG. 5 shows high-resolution TEM images of IST nanowires.

In order to examine the detailed structure of the nanowires, the surface structure of one nanowire was observed by high-resolution TEM (FE-STEM (200 keV, HD-2300A)), and the observation results are shown in FIG. 5. FIG. 5(a) is a TEM image clearly showing the nanowire, and as can be seen therein, the nanowire had a diameter of 68 nm and a length of about 1 μm. The insert in FIG. 5(a) is a TEM image showing the end of the nanowire, and as can be seen therein, the nanowire is not one formed by a catalyst. Generally, if nanowires are formed by a catalyst, a catalyst material will be detected at the ends of the formed nanowires. FIG. 5(b) is a high-resolution TEM image of the nanowire and shows that IST was completely crystallized. In order to more specifically examine the crystallization of IST, the atomic arrangement and electron diffraction pattern of the portion indicated by the box in FIG. 5(b) were observed, and the observation results are shown in FIGS. 5(c) and 5(d), respectively, and as can be seen therein, the nanowire was formed as a single crystallized IST phase even in a low-temperature process.

Example 3

Analysis of Electrical Characteristics of IST Nanowires

In order to evaluate the electrical characteristics of the IST nanowires fabricated in Example 1, Pt pad patterns (Pt electrodes) were formed at both ends of the nanowires, formed at a deposition pressure of 10 Torr, using a focused ion beam (FIB) (Dual Beam FIB system, Helios NanoLab™). FIG. 6(a) is a SEM image of the pad patterns formed by the above-described method. Voltage was applied to the electrodes at a constant rate (FIG. 6(b)) or in a pulse form (FIGS. 6(c) and 6(d)), and the current-voltage characteristics of the nanowires. As shown in FIG. 6(b), when a constant voltage was applied, current and resistance changed rapidly at a voltage of about 1.6 V. The results of applying pulse voltage that is the characteristic of an actual memory device are shown in FIGS. 6(c) and 6(d). Data reading was performed at 0.1 V. In the amorphous (RESET) state in FIG. 6(c), when pulse voltage was applied for 100 ns, a rapid change in resistance at about 9.2 V was shown, and in the crystalline (SET) state in FIG. 6(d), when pulse voltage was applied for 1 μs, a decrease in resistance at about 1.6 V was shown, suggesting that the threshold voltage of the nanowires was about 1.6 V which was consistent with the result shown in FIG. 6(b).

Such results indicated that the IST nanowires formed in Examples of the present invention exhibit memory characteristics, and thus can be used in phase-change memory devices.

As described above, according to the present invention, IST nanowires capable of substituting for the existing phase-change material GST can be easily fabricated in a large amount by metal organic chemical vapor deposition at a temperature of 300° C. or lower, and thus can be efficiently used in phase-change memory devices.

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of fabricating indium (In)-antimony (Sb)-tellurium (Te) nanowires by metal organic chemical vapor deposition, the method comprising:

providing a substrate and vapors of In, Sb and Te precursors in a chamber; and allowing the vapors to react with each other on the substrate in the chamber at a temperature of 230-300° C. and a pressure of 7-15 Torr.

2. The method of claim 1, wherein the In precursor is $In(CH_3)_3$, $In(C_2H_5)_3$, $In(C_{11}H_{19}O_2)_3$ or $In(OOCCH_3)_3$, the Sb precursor is $Sb(CH_3)_3$, $Sb(C_2H_5)_3$ or $Sb(i-C_3H_7)_3$, and the Te precursor is $Te(CH_3)_2$, $Te(C_2H_5)_2$, $Te(i-C_3H_7)_2$ or $Te(t-C_4H_9)_2$.

3. The method of claim 1, wherein the nanowires each have a diameter of 30-100 nm.

4. A phase-change memory device comprising the In—Sb—Te nanowires fabricated according to the method of claim 1.

* * * * *